United States Patent
Ohshita et al.

(10) Patent No.: US 7,247,982 B2
(45) Date of Patent: Jul. 24, 2007

(54) ORGANIC EL DISPLAY DEVICE AND METHOD FOR MANUFACTURING THE SAME

(75) Inventors: Isamu Ohshita, Yamagata-ken (JP); Teruichi Watanabe, Yamagata-ken (JP); Kunizo Ogoshi, Yamagata-ken (JP)

(73) Assignee: Tohoku Pioneer Corporation, Yamagata (JP)

( * ) Notice: Subject to any disclaimer, the term of this patent is extended or adjusted under 35 U.S.C. 154(b) by 545 days.

(21) Appl. No.: 10/701,439

(22) Filed: Nov. 6, 2003

(65) Prior Publication Data
US 2004/0090401 A1    May 13, 2004

(30) Foreign Application Priority Data
Nov. 7, 2002    (JP) ............................. 2002-323552

(51) Int. Cl.
*H05B 33/00* (2006.01)
(52) U.S. Cl. ....................................... 313/504; 313/506
(58) Field of Classification Search ................ 313/504, 313/506, 509, 512; 315/169.3; 345/36, 345/45, 76
See application file for complete search history.

(56) References Cited

U.S. PATENT DOCUMENTS 5,483,120 A * 1/1996 Murakami ................... 313/506
5,820,996 A * 10/1998 Hirai et al. .................. 428/469
6,673,643 B2 * 1/2004 Yamazaki ...................... 438/30
2004/0207316 A1 * 10/2004 Bimstock et al. ........... 313/504

FOREIGN PATENT DOCUMENTS

| JP | 11-121164 | 4/1999 |
| JP | 2001-356711 | * 12/2001 |

OTHER PUBLICATIONS

"Improved Robustness for Speech Recognition Under Noisy Conditions Using Correlated Parallel Model Combination", J. Hung et al., Institute of Information Science, 1998 IEEE, pp. 553-556.

* cited by examiner

*Primary Examiner*—Ashok Patel
(74) *Attorney, Agent, or Firm*—Arent Fox LLP

(57) ABSTRACT

There is provided an organic EL display device comprising: an underlying layer, including at least one layer formed of organic materials, formed on a substrate; organic EL elements formed thereon; and each leading electrode from the organic EL element for an electrical interconnection to an electrode of an interconnection object. In the display device, each connecting region is formed by removing the layers formed of organic materials, of the underlying layer, at a location of a thermocompression bonding for the electrical interconnection. This enables a reliable electrical interconnection between the leading electrode and the electrode of the interconnection object, thereby allowing a good display performance of each organic EL element to be kept.

6 Claims, 4 Drawing Sheets

US 7,247,982 B2

ORGANIC EL DISPLAY DEVICE AND METHOD FOR MANUFACTURING THE SAME

BACKGROUND OF THE INVENTION

The present invention relates to an organic EL (electroluminescence) display device and a method for manufacturing the same.

The present application claims priority from Japanese Application No. 2002-323552, the disclosure of which is incorporated herein by reference.

An organic EL display device shows images on an arrangement of organic EL elements, each of which works as a unit of a light-emitting element. Each organic EL element is constructed as follows; a transparent electrode of ITO or the like is formed to serve as an anode on a transparent glass substrate or the like, on which organic layers including a light-emitting layer are formed of organic compounds, furthermore on which a metallic electrode of Al or the like is formed as a cathode.

In such an organic EL display device, each functional element such as a Thin Film Transistor (hereinafter referred to as TFT) necessary for active-matrix driving or a color filter or the like for multi-color display is firstly formed on the substrate. In order to flatten an irregular (concavo-convex) surface resulting from the formation of these functional elements, an underlying layer is then formed on the entire substrate, on which each organic EL element is further formed at the location corresponding to that of an individual functional element.

A specific example of a conventional organic EL display device is disclosed, for example, in Japanese Patent Application Laid-Open No. 2001-356711, in which TFTs are formed on a substrate serving as the above-mentioned functional elements for driving individually the organic EL elements formed in a dot-matrix arrangement. The formation of TFTs and wiring layers connected to them cause the concavo-convex surface, hence a flattening layer of resin material or the like becomes necessary in order to flatten the concavo-convex surface. Furthermore, because gas components, such as moisture, emitting from the flattening layer are possible to deteriorate the organic EL element, a passivation layer is formed as a gas-barrier to prevent its deterioration, on the flattening layer. The organic EL elements, furthermore, are formed on the passivation layer.

In another conventional example, Japanese Patent Application Laid-Open No. Hei. 11-121164 discloses that color filters or color-converting filters for multi-color display are formed for serving as the above-mentioned functional elements on a substrate. Furthermore, multi-layered flattening layers of resin materials are formed in order to fill and flatten the concavo-convex surface resulting from the formation of the color filters or the color-converting filters. A passivation layer is further provided on the flattening layer, and then the organic EL elements are formed on the passivation layer.

Such an organic EL display device typically provides the underlying layer including the flattening layer or the passivation layer on the entire surface of the substrate. A simple matrix-driving display device, for example, has connecting regions on the peripheral region of the substrate, for connecting leading electrodes of each organic EL element with electrodes of peripheral circuits or driving ICs. At each connecting region, the leading electrode drawn out on the above-mentioned underlying layer is interconnected to a Chip On Flexible Printed Circuit (COF) or the like.

The COF is equipped with the driving ICs on a Flexible Printed Circuit (FPC), and a Tape Carrier Package (TCP) equipped with the IC chips by using a Tape Automated Bonding (TAB) is typically adopted. The interconnection of the TCP electrode and the leading electrode is made by thermocompression bonding of these electrodes sandwiching an anisotropic conductive film (ACF) between them. It is known that failure in the interconnection tends to occur when the leading electrode is formed on the underlying layer of organic materials such as resin or the like. This is because the underlying layer can no longer perform as a supporting base for the leading electrode due to a thermo-deterioration of the underlying layer caused by heating at the thermocompression bonding, hence the thermocompression bonding of the electrodes with the anisotropic conductive film therebetween can not be done sufficiently. More specifically, it is necessary to form at least one layer, which is formed of organic materials, in the underlying layer for flattening the concavo-convex surface on the substrate. However, because a heat-resistance critical temperature of the organic materials is substantially equal to the temperature (180° C.–200° C.) of the thermocompression bonding, the heat-deterioration of the underlying layer is inevitable as a result thereof. A reliable connection is thus hard for the thermocompression bonding of the leading electrodes on the underlying layer.

This problem is not restricted only to the connection to the COF, but the similar problems occur also in the case of the Chip On Glass (COG) equipped with the IC chips to leading electrodes above a substrate. That is, the COG employs a thermocompression bonding of an electrode of an IC chip and a leading electrode, sandwiching an anisotropic conductive film (ACF) between the two electrodes. When the bonding is performed to the leading electrode formed on the underlying layer, the heat-deterioration of the underlying layer is inevitable, so that a reliable connection may fail.

SUMMARY OF THE INVENTION

The present invention aims to cope with these problems, that is, the main object of the present invention is to provide a reliable electrical interconnection between leading electrodes of organic EL elements and objects to be interconnected (hereinafter referred to as interconnection objects), in the case of an organic EL display device or the manufacturing method of forming organic EL elements on an underlying layer formed on a substrate. In other words, the objects of the present invention are to achieve an excellent display performance of organic EL elements by the reliable interconnection between the electrodes.

In order to achieve these objects, a first aspect of the present invention is characterized by an organic EL display device comprising: a substrate; an underlying layer formed on the substrate, the underlying layer including at least one layer formed of organic materials; organic EL elements formed on the underlying layer; leading electrodes drawn out from the organic EL element for electrically connecting with an electrode of an interconnection object on the substrate; and connecting regions formed by removing at least one layer composing the underlying layer at a location corresponding to a location of thermocompression bonding for electrically connecting the leading electrode with the electrode of the interconnection object.

A second aspect of the present invention is characterized by a method for manufacturing an organic EL display device comprising the steps of: providing underlying layer formed on a substrate, the underlying layer including at least one layer formed of organic materials; forming interconnection regions by partially removing at least one layer including organic materials in the underlying layer; forming organic EL elements on the underlying layer; forming leading electrodes drawn out from the organic EL elements on the interconnection regions; and performing a thermocompression bonding between the each leading electrode and an electrode of an interconnection object, sandwiching an anisotropic conductive film between these two electrodes on the interconnection region.

BRIEF DESCRIPTION OF THE DRAWINGS

These and other objects and advantages of the present invention will become clear from the following description with reference to the accompanying drawings, wherein.

DETAILED DESCRIPTION OF THE INVENTION

Figure 1:
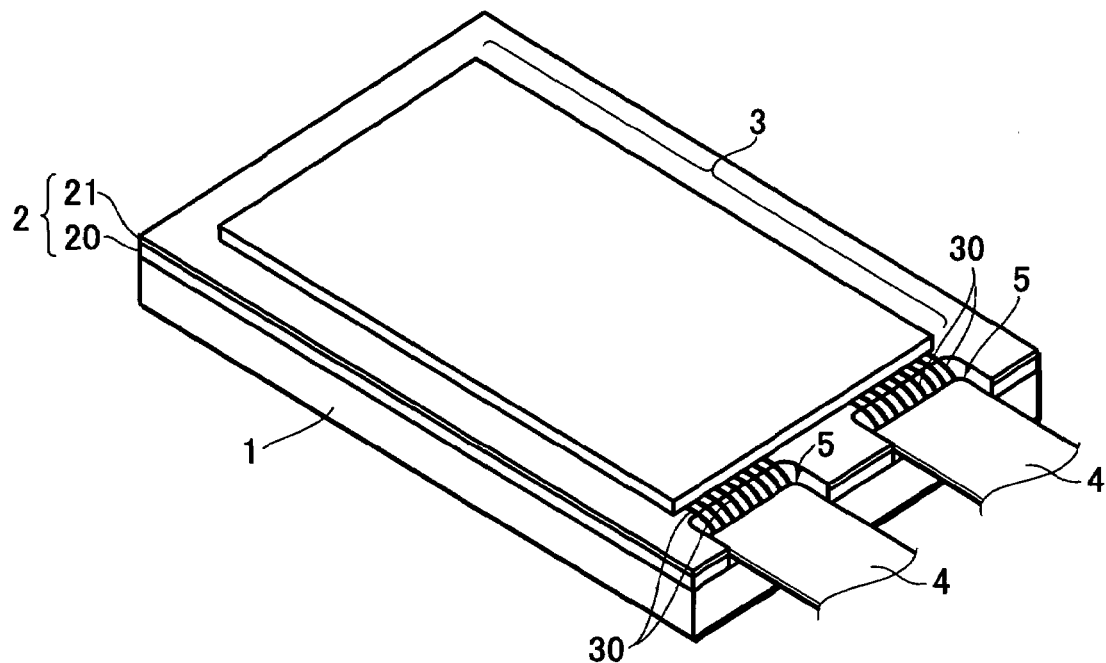
FIG. 1 is an external view for illustrating a whole structure of an organic EL display device according to an embodiment of the present invention.
Figure 2:
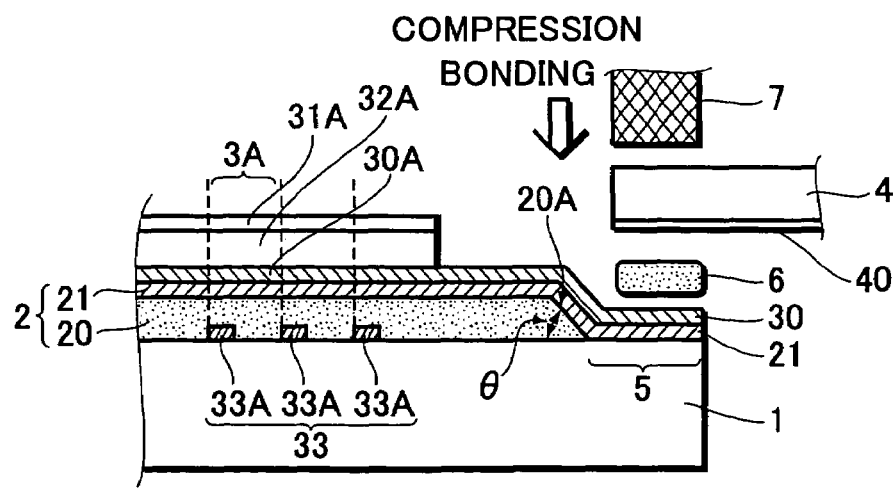
FIG. 2 is an explanatory view for illustrating a main part of an organic EL display device and a method for manufacturing an organic EL display device according to an embodiment of the present invention.

Some embodiments of the present invention will be explained referring to drawings. FIG. 1 is an external view illustrating a whole structure of an organic EL display device according to an embodiment of the present invention. FIG. 2 is an explanatory view for illustrating a main part of an organic EL display device and a method for manufacturing an organic EL display device according to an embodiment of the present invention.

In these drawings, embodiments of the present invention will be described on the assumption of an organic EL display device, in which an underlying layer 2 including at least one layer formed of organic materials is formed on a substrate 1 such as a transparent glass substrate, each organic EL element 3A (an individual element in an organic EL element area 3) is formed on the underlying layer 2, and each electrode of an interconnection object 4 is electrically interconnected to each leading electrode 30 from the organic EL elements 3A.

Each organic EL element 3A in the organic EL element area 3 composes an organic light-emitting functional layer 32A including light-emitting layers, which is formed between one electrode 30A (e.g. a transparent electrode of ITO or the like) connected to a leading electrode 30 and the other electrode 31A (e.g. a metallic electrode such as Al electrode). The interconnection object 4 is not restricted, but may be the above-mentioned TCP (TAB) used in a Chip On FPC (COF), an IC chip used in a Chip On Glass (COG), or a non-flexible circuit board used in a Chip On Board (COB).

A first embodiment of the present invention is characterized by the formation of each connecting region 5 by removing a layer included in an underlying layer 2, which is formed of organic materials, corresponding to region of a thermocompression bonding between each leading electrode 30 and an electrode of the interconnection object 4. In a view of the manufacturing method, provided is a method for manufacturing an organic EL display device comprising the steps of providing an underlying layer 2 composed of a plurality of layers, at least one layer of which is formed of organic materials on a substrate 1, forming interconnection regions 5 by partially removing a layer formed of organic materials in the underlying layer 2, forming organic EL elements 3A on the underlying layer 2, forming leading electrodes 30 extended from the organic EL elements 3A on the interconnected regions 5, and performing the thermocompression bonding of each leading electrode 30 and each electrode 40 of an interconnection object 4 at the interconnected region 5, lying an anisotropic conductive film 6 between these two electrodes, with a thermocompression bonding tool 7 (a heater tool or the like).

According to such an embodiment, the connecting regions 5 are formed by partially removing only the layer which is formed of organic materials of the underlying layer 2, at the location where the thermocompression bonding is performed. Each leading electrode 30 is located at each connecting region 5, and the thermocompression bonding of the both leading electrode 30 and electrode of the interconnection object 4 lying an anisotropic conductive film 6 between the two electrodes is performed with the thermocompression bonding tool 7. In this structure, the layer of organic materials hindering the thermocompression bonding does not exist under the location of the thermocompression bonding, and thus the anisotropic conductive film 6 is sufficiently compressed between the leading electrode 30 and the electrode 40 of the interconnection object 4, so that a reliable electric connection between the leading electrode 30 and the electrode 40 can be accomplished.

A second embodiment of the present invention presupposing the first embodiment is characterized in that an underlying layer removal surface 20A facing to the connecting region 5 is an upward tapered surface inclined to the substrate 1 within the angle range $\theta=45°\pm30°$.

This embodiment enables a further formation of new layers on the underlying layer removal surface 20A, because the surface is an upward tapered surface. Thus, another layer (a passivation layer 21) or the leading electrode 30 can be formed continuously on the underlying layer removal surface 20A as shown in FIG. 2.

The range of the inclination angle $\theta$ of the underlying layer removal surface 20A will be explained as follows. If the inclination angle $\theta$ is less than the maximum angle 75°, the new layer can be formed thereon without any separation and with a sufficient thickness for fulfilling its functions. The leading electrode 30, for instance, results in a high-resistance when a layer thereof becomes thin in thickness even if not separated, so that this negatively affects the performance of light emission of an organic EL element. In addition, the minimum angle 15° indicates a limit that the tapered-surface can be practically formed.

A third embodiment of the present invention presupposing the abovementioned embodiments is characterized in that the underlying layer 2 provides the passivation layer 21 serving as a gas-barrier formed at a top layer of the underlying layer 2.

Such a formation of the passivation layer 21 serving as a gas-barrier at the top of the underlying layer 2 containing at least one layer of organic materials, is able to confine gas components such as moisture emitted from organic materials. Thereby, deterioration, which is caused from these gases, in the leading electrode 30 or the organic light-emitting functional layer of the organic EL element 3A can be prevented. When the underlying layer removal surface 20A is formed with its tapered surface within the above-mentioned angles, a separation of the passivation layer 21 formed thereon can be avoided. When the underlying layer 2 is also removed partially to form an connecting region 5, the passivation layer 21 completely covers the underlying layer 2 including organic materials on an entire substrate thereof, thereby allowing an excellent display performance of the organic EL element 3A to be kept. At the connecting region 5 where the layer of organic materials is removed, the passivation layer 21 may be alternatively removed within the limit of not exposing organic layers. Moreover, this embodiment is not shown in the drawings.

A forth embodiment is characterized in that the underlying layer 2 involves a flattening layer 20 to flatten the concavo-convex surface due to functional elements 33 formed on the substrate 1. A fifth embodiment is characterized in that the functional element 33 is composed of each individual functional element 33A corresponding to every organic EL element 3A, and the functional element 33A may be a thin film transistor (TFT). A sixth embodiment is characterized in that the functional element 33A may be a color-converting filter or a color filter.

According to these characteristics, the organic EL elements can be formed on a flattened layer, because the flattening layer 20 is capable of flattening the concavo-convex surface due to functional elements 33, whether large or small. Thus, the control in film thickness of elements with a high precision allows high-quality elements to be formed. The abovementioned characteristics can be always obtained, even if the functional elements are TFTs, color-converting filters, or color filters. Thus, regardless of a kind of driving method such as active or passive-matrix or the number of display colors such as mono-color or multi-color, the thermocompression bonding at the connecting region of the leading electrode can be performed in the stable and good quality. Consequently, the organic EL display devices and the same manufacturing method can be supplied with the abovementioned characteristics.

EXAMPLES OF EMBODIMENT

Figure 3:
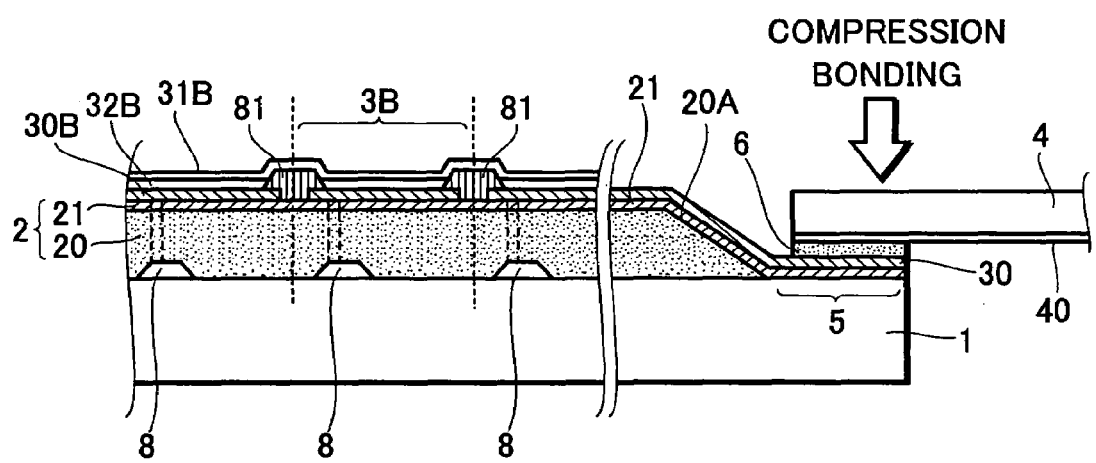
FIG. 3 is a cross sectional view of an example of an organic EL display device driven by an active-matrix according to an embodiment of the present invention.

The embodiments of the present invention will be explained referring to drawings. FIG. 3 is a drawing for illustrating an example of an organic EL display device driven by an active-matrix according to an embodiment of the present invention. In this organic EL display device, each TFT 8 is formed every organic EL element 3B composing a pixel on a substrate 1 such as transparent glass substrate, and wiring (gate wiring, drain wiring, not shown in FIG. 3) formed on the substrate 1 are connected to each TFT 8. Furthermore, a flattening layer 20 having an underlying layer removal surface 20A at a connecting region 5 is formed on the substrate 1, and a passivation layer 21 is formed for covering the flattening layer 20.

The flattening layer 20 is formed of resin materials such as acryl or polyimide, or organic materials such as organic silica or the like, using application methods such as spin-coating, dip-coating, or slot-coating. The flattening layer 20 is formed to fill and cover the concavo-convex surface resulting from TFTs 8 or wiring on the substrate 1, serving as a flat base for formation of organic EL elements 3B. The passivation layer 21 is formed of insulated materials involving inorganic materials such as silicon oxide, silicon nitride, or amorphous silicon, for working as a gas barrier which intercept gases (moisture or the like) emitted from the flattening layer 20, by using a film formation method such as ion plating, sputtering, low-temperature sputtering, evaporation, or EB.

The organic EL elements 3B are formed on the passivation layer 21 which is formed at the top layer of the underlying layer 2 including the flattening layer 20. In this embodiment, the organic EL element 3B has a structure of emitting light to the substrate 1. That is, a pixel electrode 30B is formed of transparent materials such as ITO or the like, as an anode on the underlying layer 2, on which an organic light-emitting functional layer 32B including, for instance, a hole injection layer, a hole transport layer, a light-emitting layer, an electron transport layer, and an electron injection layer, is formed. Furthermore, a common metallic electrode 31B is formed as a cathode thereon. An insulating layer 81 is formed for separating each pixel electrode 30B and an organic light-emitting functional layer 32B from adjacent pixel electrodes and adjacent organic light-emitting functional layers 32B, respectively. A structure of emitting light to a substrate is shown here as an example, but a structure of emitting light to a reverse (upward) direction may be formed by reversing the formation order of the organic light-emitting functional layers and also the order of the upper and lower electrodes.

The connecting region 5 is formed at a periphery of a substrate 1 by partially removing the flattening layer 20 formed of organic materials. The underlying layer removal surface 20A is an upward tapered plane adjacent to the connecting region 5, which is formed when removing the flattening layer. The whole surface of connecting region 5 including the flattening layer removal surface 20A is covered with the passivation layer 21, on which each leading electrode 30 connected to the above-mentioned pixel electrode 30B is formed. Thus, at the connecting region 5, a region without the flattening layer 20 formed of organic materials serves as a compression bonding region, in which a thermocompression bonding is performed between the leading electrode 30 and an electrode 40 of an interconnection object 4 (e.g. TCP (TAB)) sandwiching an anisotropic conductive film 6 therebetween.

Figure 4:
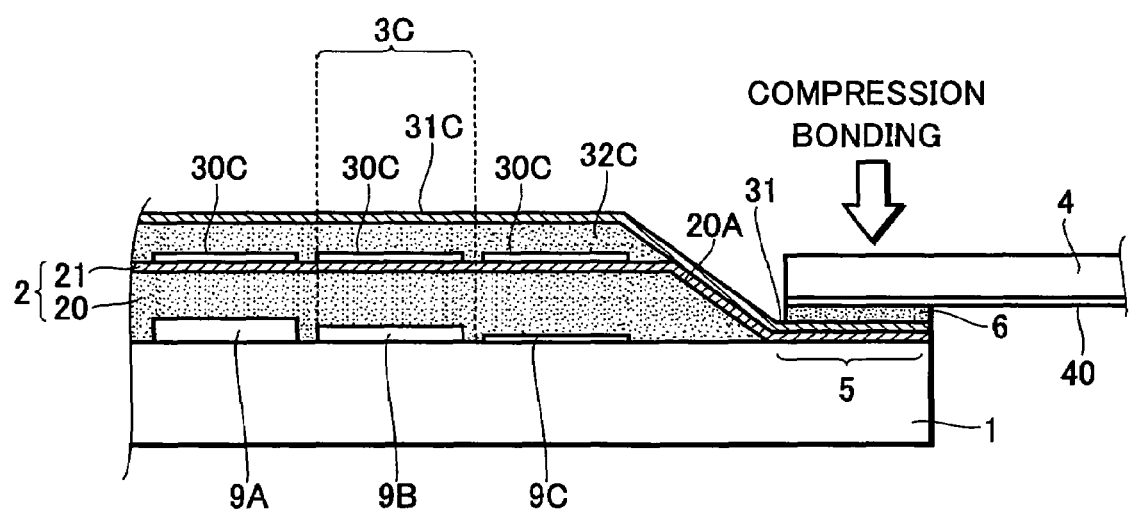
FIG. 4 is a cross sectional view of an example of an organic EL display device driven by a passive-matrix according to an embodiment of the present invention.

FIG. 4 is an explanatory view of an organic EL display device driven by a passive-matrix according to another embodiment of the present invention. In this figure, each part which is common to that of the abovementioned embodiment will be denoted by the same symbol, and the explanation for the common parts will be omitted. In the organic EL display device, each color converting filter or color filter 9A, 9B, 9C, for multi-color display is formed corresponding to every organic EL element 3C serving as a pixel, on a substrate 1 such as transparent glass or the like. Furthermore, on the substrate 1 is formed a flattening layer 20 having an underlying layer removal surface 20A facing to a connecting region 5, on which a passivation layer 21 is formed to cover the flattening layer 20.

Each organic EL element 3C is formed on the underlying layer 2 including the flattening layer 20 and the passivation layer 21. In this embodiment, the organic EL element 3C emits light to the substrate 1. That is, lower electrodes 30C are formed of transparent materials such as ITO or the like with striped pattern serving as an anode on the underlying layer 2, on which an organic light-emitting functional layer 32C including, for instance, a hole injection layer, a hole transport layer, a light-emitting layer, an electron transport layer, and an electron injection layer, is formed. Then, on the organic light-emitting functional layer 32C, upper electrodes 31C (metallic electrode such as Al or the like) are formed with a striped pattern crossing with the lower electrodes 30C. A structure of emitting light in a direction to a substrate 1 is shown here as an example, but a structure of emitting light in the reverse (upward) direction may be also formed by reversing the order of an organic light-emitting functional layers and also the order of the upper and lower electrodes.

Similarly to the first embodiment, the connecting region 5 is formed at the periphery of the substrate 1 by partial removal of the flattening layer 20 formed of organic materials. The underlying layer removal surface 20A is formed with an upward tapered plane facing to the connecting region 5, after removing the flattening layer 20. The whole surface of connecting region 5 including the flattening layer removal surface 20A is covered with the passivation layer 21, on which a leading electrode 31 connected to the abovementioned upper electrode 31C is formed. Thus, in this embodiment also, a region with the flattening layer 20 removed also serves as a compression bonding region at the connecting region 5, in which a thermocompression bonding is performed between the leading electrode 31 and an electrode 40 of an interconnection object 4 (e.g. TCP (TAB)) sandwiching an anisotropic conductive film 6 therebetween.

Figure 5:
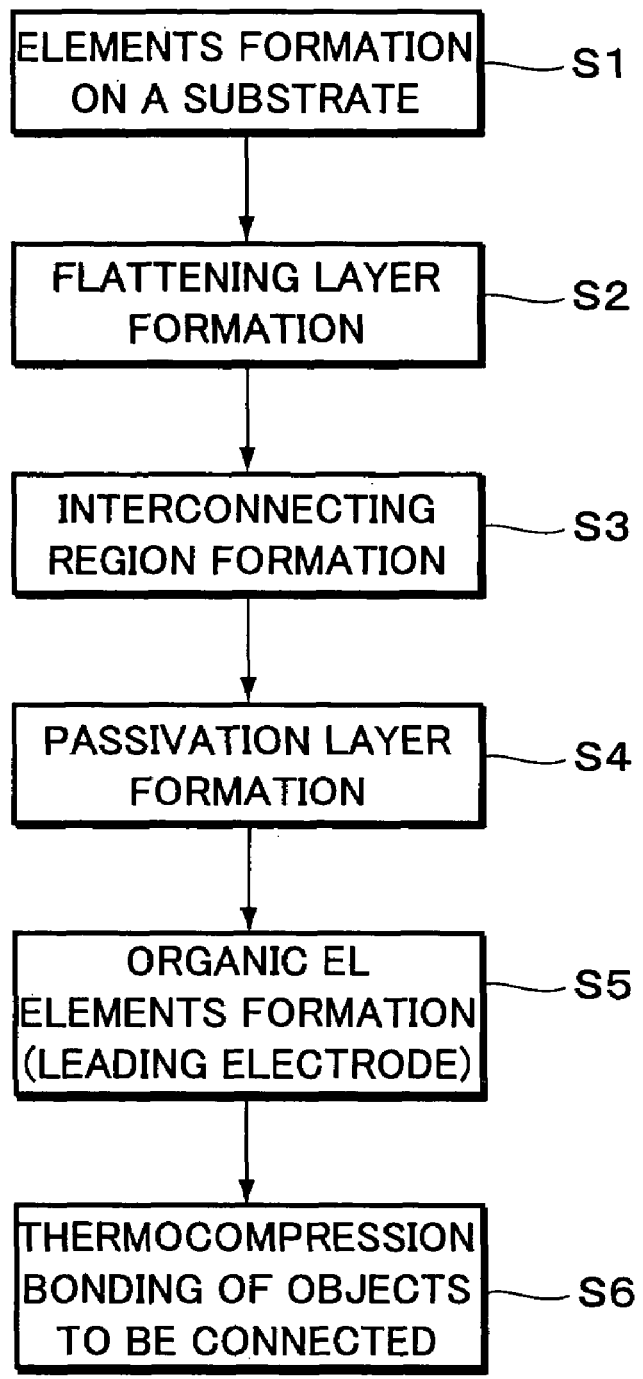
FIG. 5 is a flowchart for explaining a method for manufacturing an organic EL display device according to an embodiment of the present invention.

Next, a method for manufacturing such organic EL display devices will be explained referring to the flowchart illustrated in FIG. 5. First, at the step S1, each element such as TFT 8, color converting filter or color filter 9A, 9B, and 9C is formed to serve as an active-matrix driving, or a functional element for multi-color display, on the substrate 1.

At the step S2, the abovementioned flattening layer 20 is formed by a coating method such as a spin-coating on the entire substrate 1 in which the abovementioned elements have been formed on the substrate 1. Then, at the step S3, each connecting region 5 is formed by removing the flattening layer 20, at the location of the thermocompression bonding to the interconnection object 4. At the step S4, the passivation layer 21 is formed on the upper surface of the flattening layer 20 and also the substrate in the connecting region 5.

Figure 6:
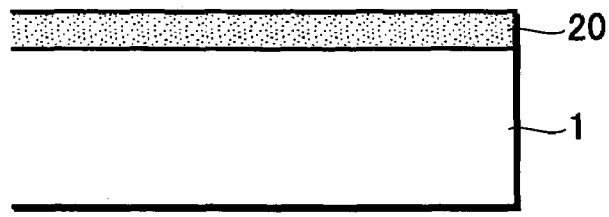
FIGS. 6A to 6D are explanatory views for illustrating a method for manufacture (steps of forming an interconnection region are mainly shown) of an organic EL display device according to an embodiment of the present invention.
Figure 6:
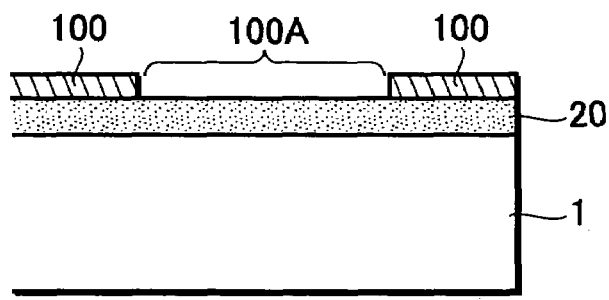
Figure 6:
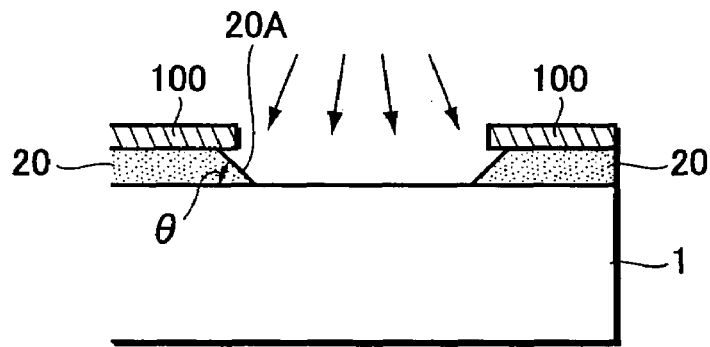
Figure 6:
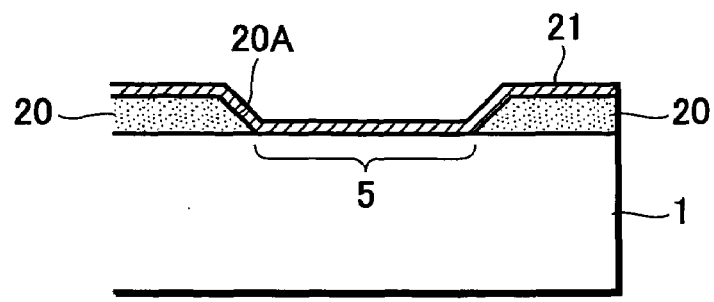

More detailed description will be given with regard to the process (step 3) of forming the connecting region and the process (step 4) of forming the passivation layer, referring to FIG. 6. First, the flattening layer 20 is formed on the substrate 1 by using the abovementioned coating method, as shown in FIG. 6A. Next, a resist layer 100, which has openings 100A formed by using lithography technique or the like at the location of the connecting regions 5, is formed on the flattening layer 20.

The flattening layer 20 under the opening 100A is removed by using developing process. Under this removal situation, the developing fluid enters into the underside of the resist layer 100 near an edge thereof, so that the underlying layer removal surface 20A is formed in a tapered shape, as shown in FIG. 6C. Therefore, it becomes possible to adjust an inclination angle θ of the tapered surface, by controlling the duration-time of developing process.

The setting of the inclination angle θ of the tapered surface (underlying layer removal surface 20A) is an important factor for obtaining excellent performances of the organic EL display device. In this embodiment, it has been confirmed that the inclination angle θ is effective in the range from 15° to 75° (θ=45°±30°). That is, when the angle is smaller than 15°, it is difficult to form the tapered surface itself, and it is also impossible to utilize the substrate effectively, because of the formation of the wider tapered surface near the connecting region. On the other hand, when the angle is larger than 75° near a right angle, the respective separation in the passivation layer and the leading electrode formed on the tapered surface may be suffered, and it may be also difficult to obtain the sufficient thickness capable of serving as the passivation layer or the leading electrode. Therefore, the setting of the inclination angle θ ranging 45°±30° results in an excellent performance of the organic EL display device because any separation of the leading electrode or the passivation layer can be avoided.

Following these processes, the resist layer is removed, and a passivation layer 21 is formed on both the flattening layer 20 and the substrate 1 at the connecting region 5, as shown in FIG. 6D. At the step S5 in FIG. 5, the organic EL element (3A, 3B, or 3C) is formed on the underlying layer 2 including the flattening layer 20 and the passivation layer 21, and the leading electrode (30, 31) is formed at the location of the connecting region 5. At the step S6, the thermocompression bonding is performed to connect the leading electrode with the interconnection object 4 at the connecting region 5 where the flattening layer 20 is removed.

In the organic EL display device and its manufacturing method according to the above-mentioned embodiments, the connecting region 5 is formed by partially removing the flattening layer 20 formed of organic materials at the location of the thermocompression bonding. Then, at the connecting region 5, the thermocompression bonding is performed between the leading electrode (30, 31) from the organic EL element (3A, 3B, 3C) and the electrode 40 of the interconnection object 4, sandwiching the isotropic conductive film 6 therebetween. Owing to the absence of layers formed of organic materials, which hinder the thermocompression bonding beneath the location of connecting region, the isotropic conductive film 6, which is sandwiched between the leading electrode (30, 31) from an organic EL element (3A, 3B, 3C) and the electrode 40 of the interconnection object 4, is able to be pressed sufficiently. Therefore, a reliable electric connection between the leading electrode (30, 31) and the electrode 40 can be achieved.

Because the underlying layer removal surface 20A has an upward tapered surface, on which layers can be formed thereon by deposition. When the inclination angle θ of the tapered surface is set in the range of θ=45°±30°, the passivation layer 21 or the leading electrode 30 can be formed on the flattening layer 20 without separation or cutting on the tapered surface, so that the organic EL element (3A, 3B, 3C) can retain a good display performance.

Although the embodiments described above show an example of forming the passivation layer on the connecting region 5, the surface of the substrate 1 may be exposed by removing the passivation layer 21 if the flattening layer is not exposed.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An organic EL display device comprising:
   a substrate;
   an underlying layer formed on said substrate, said underlying layer including a flattening layer formed of organic materials and a passivation layer formed on the flattening layer and the substrate;

organic EL elements formed on the passivation layer of said underlying layer;

leading electrodes drawn out from said organic EL element for electrically connecting with an electrode of an interconnection object on said substrate; and connecting regions wherein the flattening layer composing said underlying layer at a location corresponding to a location of thermo-compression bonding is removed for electrically connecting said leading electrode with said electrode of the interconnection object without fail, wherein a flattening layer removal surface of the underlying layer adjacent to the connection region has an upward tapered surface inclined relative to the substrate.

2. The organic EL display device according to claim 1, wherein the upward tapered surface inclines relative to the substrate within an angle range of 45°±30°.

3. The organic EL display device according to claim 1, wherein the passivation layer serves as a gas-barrier.

4. The organic EL display device according to claim 1, wherein the flattening layer flattens a concavo-convex surface caused by functional elements provided on the substrate.

5. The organic EL display device according to claim 4, wherein the functional elements are thin film transistors provided on said substrate.

6. The organic EL display device according to claim 4, wherein said functional elements are color converting filters or color filters provided on said substrate.

* * * * *